United States Patent
Maki et al.

(10) Patent No.: US 12,061,236 B2
(45) Date of Patent: Aug. 13, 2024

(54) POWER CONVERSION DEVICE, ROTATING MACHINE SYSTEM, AND DIAGNOSIS METHOD

(71) Applicant: Hitachi Industrial Equipment Systems Co., Ltd., Tokyo (JP)

(72) Inventors: Kohji Maki, Tokyo (JP); Yoshitaka Iwaji, Tokyo (JP); Hironori Ohashi, Tokyo (JP); Atsuhiko Nakamura, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 467 days.

(21) Appl. No.: 17/417,453

(22) PCT Filed: Nov. 28, 2019

(86) PCT No.: PCT/JP2019/046562
§ 371 (c)(1),
(2) Date: Mar. 3, 2022

(87) PCT Pub. No.: WO2020/144965
PCT Pub. Date: Jul. 16, 2020

(65) Prior Publication Data
US 2022/0229113 A1   Jul. 21, 2022

(30) Foreign Application Priority Data
Jan. 10, 2019   (JP) .................................. 2019-002459

(51) Int. Cl.
H02P 29/024 (2016.01)
G01R 31/34 (2020.01)
(Continued)

(52) U.S. Cl.
CPC ............ *G01R 31/343* (2013.01); *H02H 5/041* (2013.01); *H02M 1/0009* (2021.05); *H02P 29/0241* (2016.02)

(58) Field of Classification Search
CPC ... H02H 5/041; H02P 29/0241; H02M 1/0009
See application file for complete search history.

(56) References Cited

U.S. PATENT DOCUMENTS

2013/0342150 A1* 12/2013 Ozaki ................. F16H 57/0476
                                                          318/490
2016/0141994 A1*  5/2016 Takase ................... H02P 21/22
                                                          318/135
(Continued)

FOREIGN PATENT DOCUMENTS

EP    3 376 242 A1   9/2018
JP    10-191690 A    7/1998
(Continued)

OTHER PUBLICATIONS

Extended European Search Report issued in European Application No. 19909521.7 dated Sep. 26, 2022 (11 pages).
(Continued)

*Primary Examiner* — Rina I Duda
(74) *Attorney, Agent, or Firm* — Crowell & Moring LLP

(57) ABSTRACT

This power conversion device has: a current measurement unit for measuring phase current; a current vector calculation unit for calculating a current vector by performing 3-phase to 2-phase conversion on the phase current; an amount-to-be-analyzed calculation unit for calculating, on the basis of the current vector, an amount to be analyzed; and a feature amount waveform extraction unit for extracting a waveform in a specific frequency range on the basis of the amount to be analyzed.

11 Claims, 9 Drawing Sheets

(51) Int. Cl.
*H02H 5/04* (2006.01)
*H02M 1/00* (2006.01)

(56) References Cited

U.S. PATENT DOCUMENTS

2017/0104431 A1* 4/2017 Hachiya .................. H02P 29/40
2017/0126153 A1* 5/2017 Lepka ...................... H02P 6/12

FOREIGN PATENT DOCUMENTS

| JP | 2013-55713 A | 3/2003 |
| JP | 2009-296788 A | 12/2009 |
| JP | 2011-252753 A | 12/2011 |
| JP | 2018-183017 A | 11/2018 |
| WO | WO 2014/156386 A1 | 10/2014 |

OTHER PUBLICATIONS

Chinese-language Office Action issued in Chinese Application No. 201980087621.9 dated May 27, 2023 (11 pages).
International Search Report (PCT/ISA/210) issued in PCT Application No. PCT/JP2019/046562 dated Feb. 18, 2020 with English translation (five (5) pages).
Japanese-language Written Opinion (PCT/ISA/237) issued in PCT Application No. PCT/JP2019/046562 dated Feb. 18, 2020 (five (5) pages).

* cited by examiner

F I G. 1
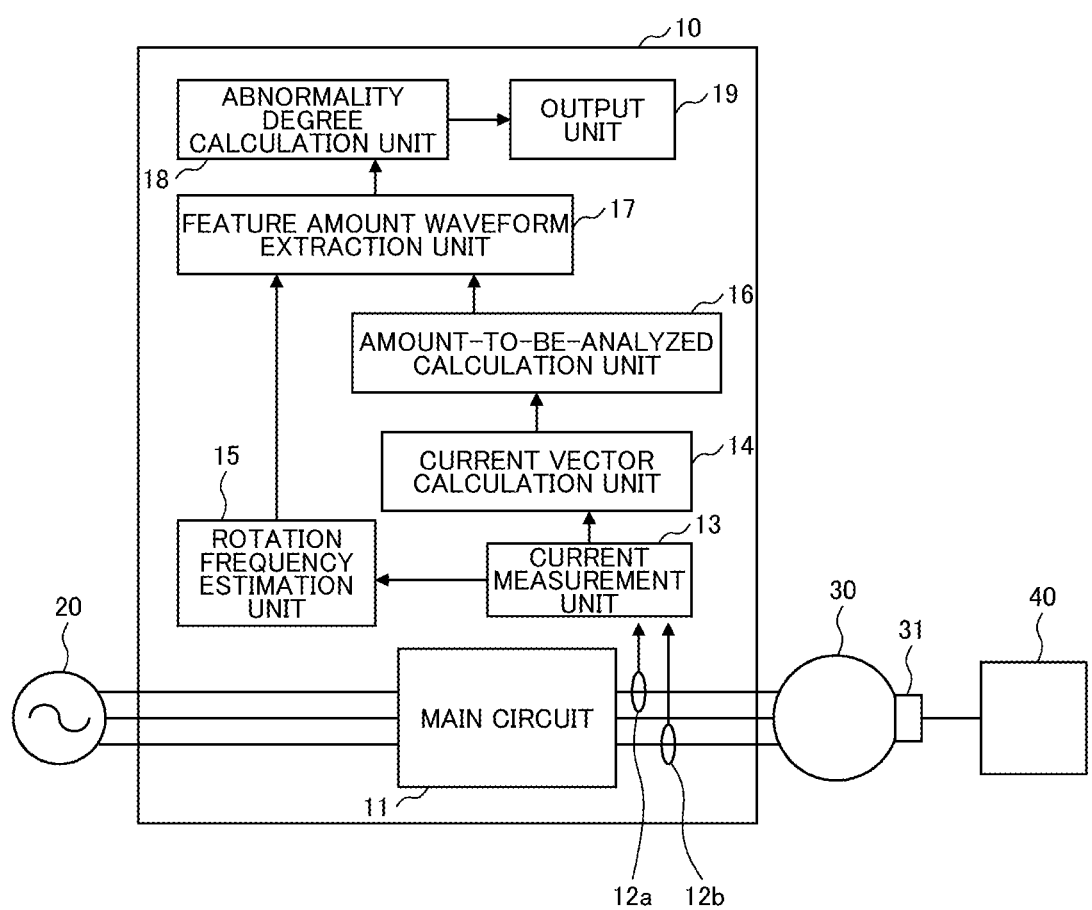

F I G. 1 0
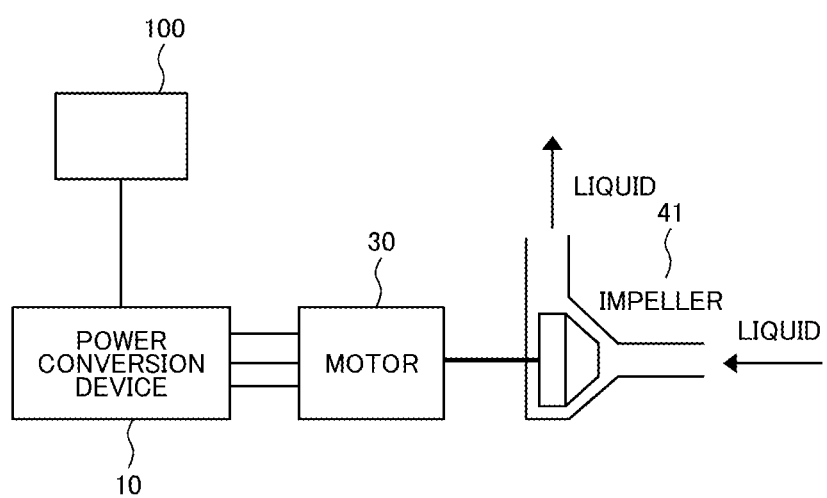

POWER CONVERSION DEVICE, ROTATING MACHINE SYSTEM, AND DIAGNOSIS METHOD

TECHNICAL FIELD

The present invention relates to a power conversion device, a rotating machine system including a rotating machine such as a motor or a power generator, and a diagnosis method.

BACKGROUND ART

In a case where a rotating machine such as a motor or a power generator stops due to a catastrophic failure, a great damage occurs. In particular, the stoppage due to the catastrophic failure of the rotating machine that is used in a plant facility or the like has a serious effect such as a decrease in an operation rate of a productive facility or a necessity for readjustment of a production plan. For this reason, needs for preventing the catastrophic failure of the rotating machine by implementing failure symptom diagnosis with a high accuracy in a state where the rotating machine is being used in the actual environment increase.

In response to such needs, a technology of measuring a current at the time of operating the rotating machine, of performing frequency analysis on a waveform thereof, and of diagnosing various abnormalities has been disclosed. However, in such a technology, calculator capacity only for performing the frequency analysis (a calculation speed and a memory amount) is necessary, and thus, a power conversion device such as a general-purpose inverter is not capable of being provided with a diagnosis function, and it is necessary to prepare a calculator such as an industrial PC. For this reason, there is a problem that a diagnosis device is generally expensive and is introduced only into a few sites in which cost-benefit performance is expected.

On the other hand, a technology of detecting an abnormality without performing the frequency analysis has also been proposed on the premise of performing abnormality diagnosis with a more inexpensive device. For example, in Patent Document 1, a technology of detecting four types of different abnormalities (an earth fault, a layer short, a bearing defect, and a torque abnormality) by measuring a zero phase current, a phase current, and a phase voltage has been disclosed. In particular, in the bearing defect, a component of an output frequency of ±20 Hz is cut out from a phase current with a bandpass filter, and the abnormality diagnosis is performed by the comparison with a reference value in a frequency band excluding the output frequency.

CITATION LIST

Patent Document

Patent Document 1: WO 2014/156386

SUMMARY OF THE INVENTION

Problems to be Solved by the Invention

Patent Document 1 is a technology of performing the abnormality diagnosis with an inexpensive device, and the bandpass filter is applied to the phase current to cross the output frequency, and thus, it is necessary to separately remove an output frequency component positioned in the center. However, the output frequency component is extremely larger than an abnormality sign to be detected, and thus, it is difficult to remove the output frequency component without causing a decrease in an abnormality detection sensitivity.

Therefore, a technology is desirable in which a failure symptom can be detected at a low cost and at an early point without decreasing an abnormality detection sensitivity.

An object of the present invention is to detect a failure symptom at a low cost and at an early point.

Solutions to Problems

A preferred example of the present invention is a power conversion device, including: a current measurement unit measuring a phase current; a current vector calculation unit calculating a current vector by performing 3-phase to 2-phase conversion on the phase current; an amount-to-be-analyzed calculation unit calculating an amount-to-be-analyzed, on the basis of the current vector; and a feature amount waveform extraction unit extracting a waveform in a specific frequency range, on the basis of amount-to-be-analyzed.

In addition, another preferred example of the present invention is a rotating machine system provided with a rotating machine and a power conversion device connected to the rotating machine, the system including: a current measurement unit measuring a phase current; a current vector calculation unit calculating a current vector by performing 3-phase to 2-phase conversion on the phase current; an amount-to-be-analyzed calculation unit calculating an amount-to-be-analyzed, on the basis of the current vector; a feature amount waveform extraction unit extracting a waveform in a specific frequency range, on the basis of the amount-to-be-analyzed; and an abnormality degree calculation unit calculating an abnormality degree, on the basis of the extracted waveform.

In addition, another preferred example of the present invention is a diagnosis method of diagnosing a system provided with a power conversion device, the method including: allowing the power conversion device to measure a phase current; to calculate a current vector by performing 3-phase to 2-phase conversion on the phase current; to calculate an amount-to-be-analyzed, on the basis of the current vector; and to extract a waveform in a specific frequency range, on the basis of the amount-to-be-analyzed.

Effects of the Invention

According to the present invention, a failure symptom can be detected at a low cost and at an early point.

BRIEF DESCRIPTION OF THE DRAWINGS

FIG. 1 is a basic configuration diagram of a power conversion device of Example 1, and a rotating machine system using the power conversion device.

FIG. 10 is a schematic view of a pump in which a power conversion device and a rotating machine system using the power conversion device are built.

MODE FOR CARRYING OUT THE INVENTION

Figure 2:
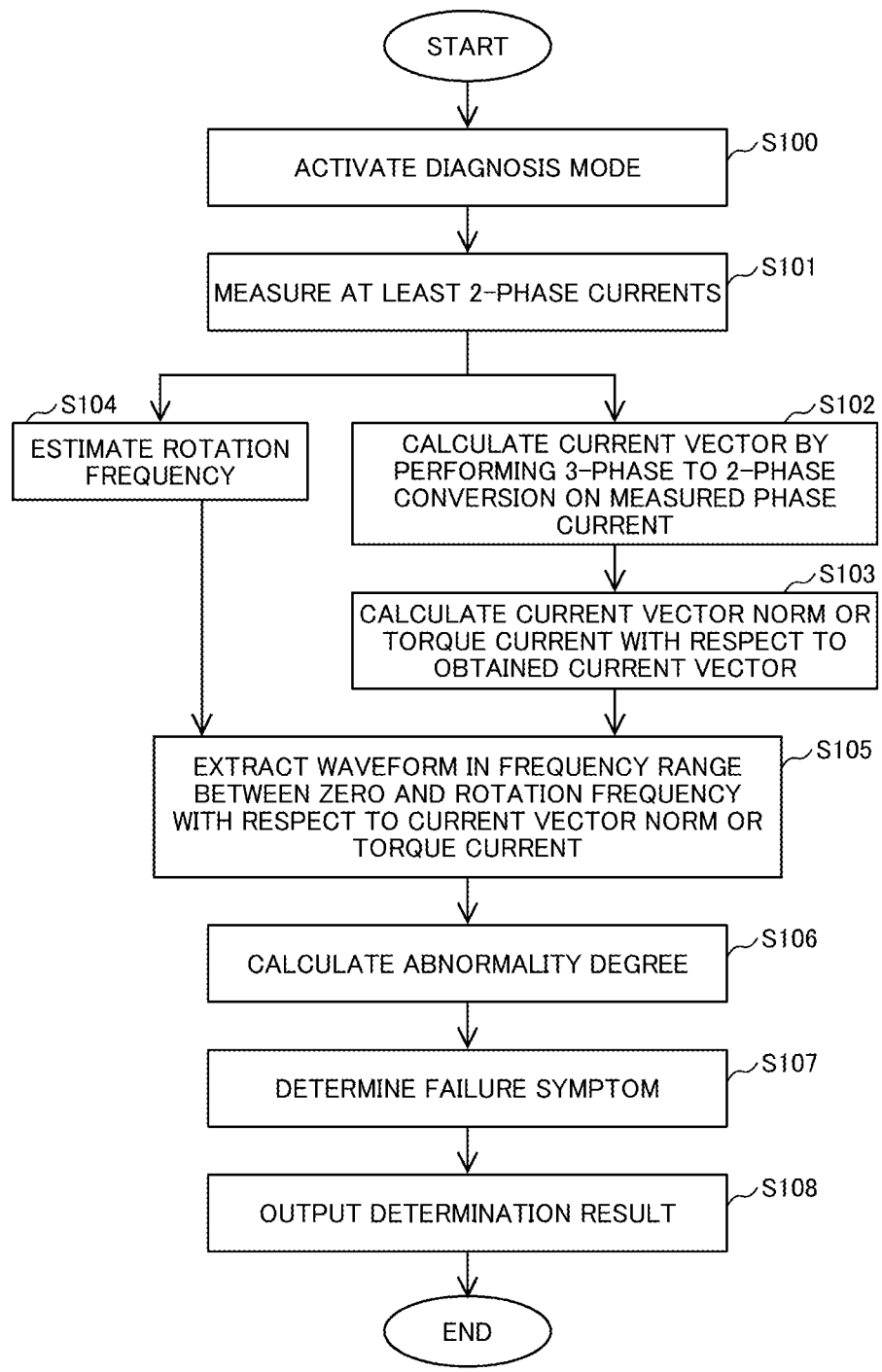
FIG. 2 is a flowchart for diagnosing an abnormality of the rotating machine system, which is provided in the power conversion device of Example 1.

Hereinafter, examples of the present invention will be described by using the drawings.

Example 1

FIG. 1 is a basic configuration diagram of a power conversion device of Example 1, and a rotating machine system using the power conversion device. This rotating machine system includes a power conversion device 10 provided with a main circuit 11 and current sensors 12a and 12b, a power source 20 that is connected to the power conversion device 10 and performs power transfer, and a rotating machine 30. In the rotating machine, a bearing 31 is provided, and a load machine 40 is connected to the tip of the rotation shaft. The power conversion device 10 further has functions such as a current measurement unit 13 measuring a phase current that is detected by the current sensors 12a and 12b, a current vector calculation unit 14 calculating a current vector by performing 3-phase to 2-phase conversion on the measured phase current, a rotation frequency estimation unit 15 estimating a rotation frequency of the rotating machine 30, an amount-to-be-analyzed calculation unit 16 calculating an amount-to-be-analyzed, on the basis of the calculated current vector, a feature amount waveform extraction unit 17 extracting a waveform in a frequency range that is specified on the basis of the estimated rotation frequency and the amount-to-be-analyzed, an abnormality degree calculation unit 18 calculating an abnormality degree from the extracted waveform, and an output unit 19 outputting a diagnosis result. Such functions are stored as a program in a storage unit, and a control unit (not illustrated) such as a microcomputer of the power conversion device 10 reads out the program and performs each of the functions.

In FIG. 1, the current sensors 12a and 12b detecting 2-phase currents are provided, but current sensors may be provided in 3-phase currents, respectively. In addition, a current sensor having diagnosis performance may be provided outside the power conversion device 10 such as the rotating machine 30, separately from a current sensor for control that is provided in the power conversion device.

In a case where some lubrication failures occur in the bearing 31 of the rotating machine 30, and a general friction variation increases, an average spectrum level in the vicinity of a basic wave frequency of the phase current (for example, ±20 Hz) increases. Here, the basic wave frequency of the phase current is an output frequency of the power conversion device. In the related art, the sign of a lubrication failure is detected by implementing frequency analysis such as fast Fourier transformation (FFT). For this reason, a microcomputer for control that is generally provided in the power conversion device is not capable of keeping up with a memory amount or a calculation speed, and thus, it is necessary to additionally provide an expensive measurement device.

Therefore, in Example 1, only a frequency range in which an abnormality sign appears is cut out with a filter by using the microcomputer and the current sensor that are generally provided in the power conversion device 10, without performing the frequency analysis. Specifically, a waveform in a frequency range between zero and a rotation frequency is extracted by allowing a current vector norm or a torque current after the 3-phase to 2-phase conversion to pass through the filter, and an abnormality such as an increase in the general friction variation of the bearing is detected. Note that, in a case where a feature frequency corresponding to a regional flaw of the bearing is in the frequency range between zero and the rotation frequency, the sign thereof can be detected.

FIG. 2 is a flowchart for diagnosing the abnormality of the rotating machine system, which is provided in the power conversion device 10 of Example 1. First, in step S100, a diagnosis mode is activated. A mechanical button for activating the diagnosis mode may be pressed, or a "diagnosis mode" button displayed on a display may be touched, in addition to a method of selecting the diagnosis mode from setting items of the power conversion device 10. Alternatively, the diagnosis mode may be set such that the diagnosis mode is automatically activated on a specific date and time, or may be set such that the diagnosis mode is automatically activated when the amplitude of the basic wave frequency of the phase current is continuously in a specific range for a specific time. Alternatively, the diagnosis mode may be set such that the diagnosis mode is automatically activated before or after a specific rotating machine control operation.

Figure 3:
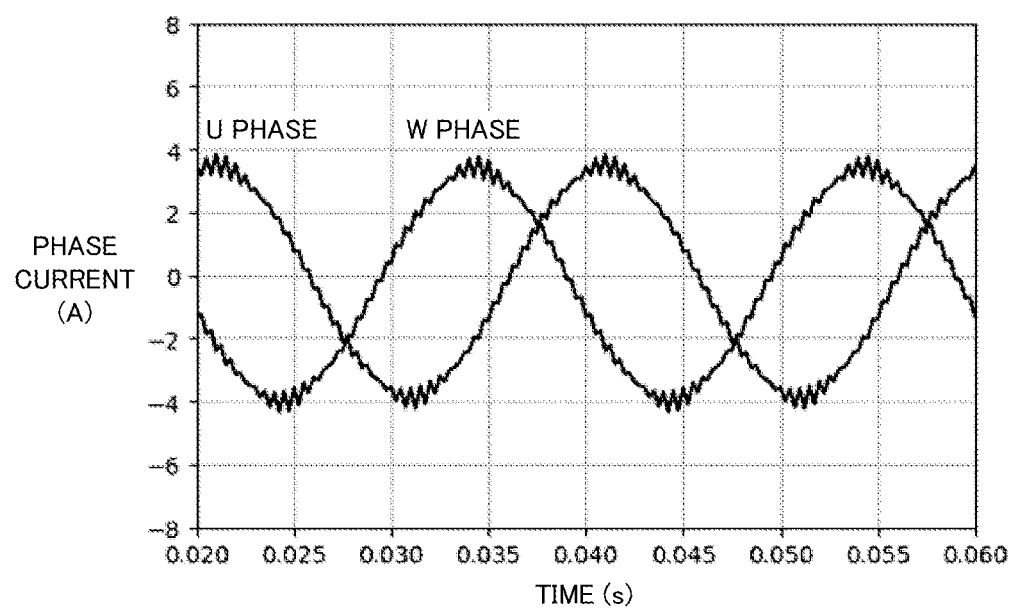
FIG. 3 is a diagram showing a representative phase current waveform that is measured in Example 1.

Next, the current measurement unit 13 inputs the current detected by the current sensors 12a and 12b and measures at least 2-phase currents (step S101). Alternatively, all-phase currents may be measured. The current measurement is implemented in synchronization with a voltage pulse that is generated by the power conversion device 10 to drive the rotating machine 30. That is, signals from the current sensors 12a and 12b are subjected to sampling in synchronization with the voltage pulse. The sampling may be performed once or twice per one voltage pulse. The sampling may be performed once per a plurality of voltage pulses. For example, an example of a 2-phase current waveform that is obtained by performing the sampling twice per one voltage pulse is shown in FIG. 3.

Next, the current vector calculation unit 14 implements the 3-phase to 2-phase conversion on the measured phase current, in accordance with Expression (1) described below, and calculates the current vector (step S102). In the power conversion device 10 of FIG. 1, only 2-phase currents are measured, and thus, a value derived by assuming that Expression (2) is satisfied is used as the remaining 1-phase current.

[Expression 1]

$$i_\alpha = \sqrt{\frac{2}{3}} \cdot i_U - \frac{1}{\sqrt{6}}(i_V + i_W)$$

$$i_\beta = \frac{1}{\sqrt{2}}(i_V - i_W)$$

Expression (1)

Here, $i_u$, $i_v$, and $i_w$ indicate measurement currents of a U phase, a V phase, and a W phase, respectively, and $i_\alpha$, and $i_β$ indicate current components on 2-phase fixed axes of an α axis and a β axis after the 3-phase to 2-phase conversion, respectively.

[Expression 2]

$$i_U + i_V + i_W = 0 \qquad \text{Expression (2)}$$

Next, the amount-to-be-analyzed calculation unit 16 calculates the current vector norm that is one of the amounts-to-be-analyzed represented by Expression (3) with respect to the obtained current vector (step S103).

[Expression 3]

$$\sqrt{i_α^2 + i_β^2} \qquad \text{Expression (3)}$$

Figure 4:
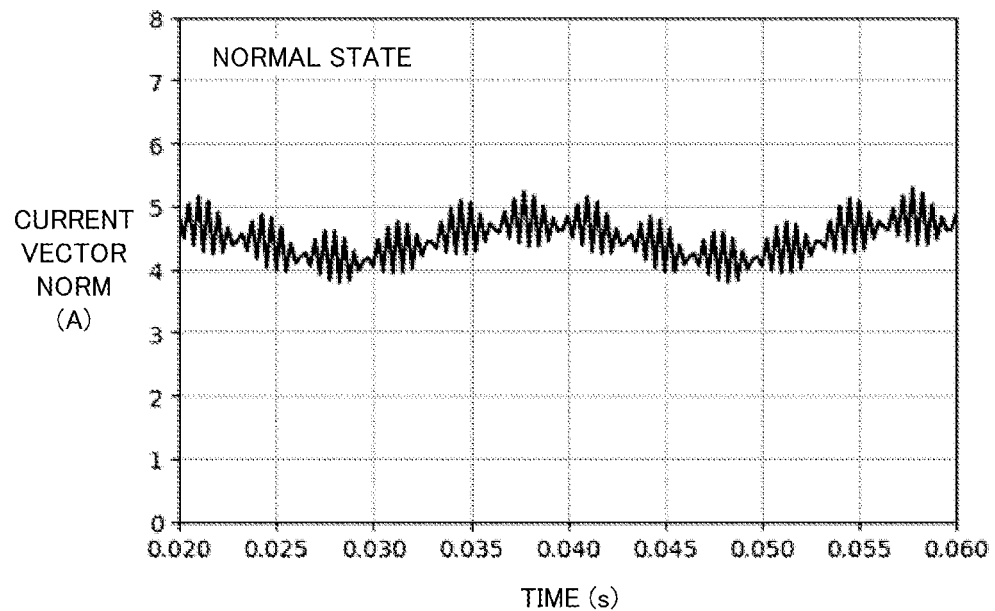
FIG. 4 is a diagram showing a representative current vector norm waveform that is calculated in Example 1.
Figure 4:
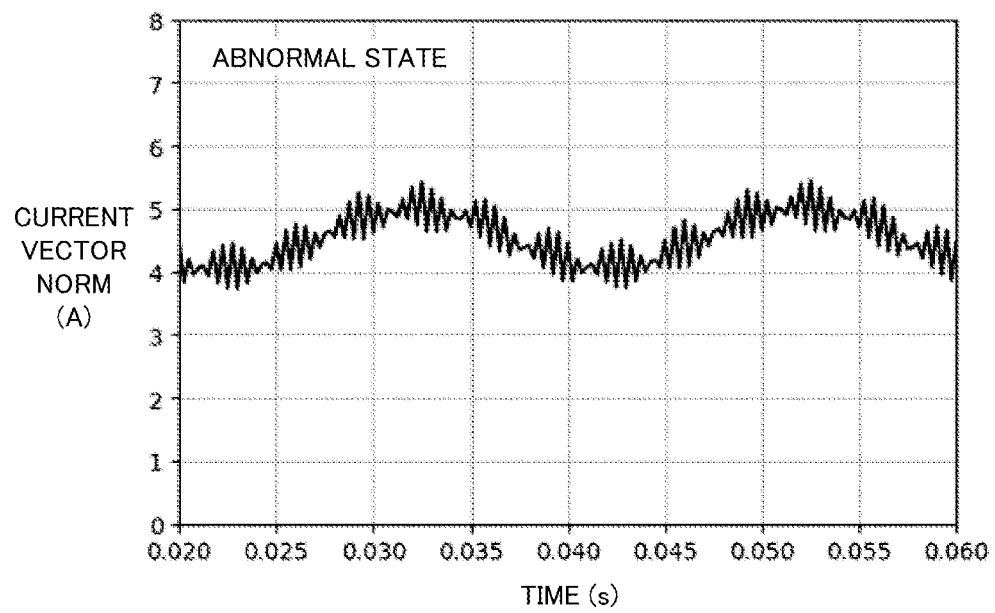

FIG. 4 is a diagram showing a relationship between the calculated current vector norm and a time with respect to the rotating machine 30 in a normal state and the rotating machine 30 in an abnormal state. Note that, the rotating machine 30 in the abnormal state is represented by a state in which the grease of the bearing is reduced from the rotating machine 30 in the normal state.

Further, the current vector may be converted into a rotation coordinate system by using Expression (4), and a q-axis current (the torque current) may be calculated and may be used in the subsequent analysis as the amount-to-be-analyzed, instead of the current vector norm. A rotor position θ in Expression (4) may be obtained from a signal of a rotation position sensor such as a resolver or an encoder that is provided in the rotating machine 30, or may be estimated from information included in a speed electromotive force or a current of the rotating machine 30.

[Expression 4]

$$i_d = i_α \cdot \cos θ + i_β \cdot \sin θ \qquad \text{Expression (4)}$$
$$i_q = -i_α \cdot \sin θ + i_β \cdot \cos θ$$

Here, $i_d$ and $i_q$ indicate a d-axis current and the q-axis current, respectively, and θ indicates a rotation position.

In the case of an ideal 3-phase alternate current, in a frequency spectrum of the current vector norm or the torque current, a basic wave frequency component is converted into a peak of a direct current component, and thus, the frequency spectrum is a frequency spectrum having one peak of a rotation frequency component with respect to the direct current component. In a frequency spectrum of the phase current, one peak of the basic wave frequency component and two peaks of ±rotation frequency component before and after the peak appear, and thus, the both frequency spectrums are different from each other.

On the other hand, the rotation frequency estimation unit 15 estimates the rotation frequency of the rotating machine 30, along with the amount-to-be-analyzed calculation unit 16 (step S104). In a case where the amount-to-be-analyzed calculation unit 16 implements rotor position estimation in step S103, the rotation frequency can also be estimated at the same time. In a case where the rotation position sensor is not provided in the rotating machine 30, the rotation frequency may be estimated from the output frequency of the power conversion device 10 and the number of poles of the rotating machine 30. The output frequency of the power conversion device 10 is estimated from information of the phase current or is extracted from information of a control command.

In the case of ignoring a slip that occurs in an induction motor at the maximum rate of approximately several %, the rotation frequency is estimated from the output frequency of the power conversion device 10 and the number of poles of the rotating machine 30, as follows. From Rotation Frequency=Output Frequency of Power Conversion Device/Number of Pole Pairs, and thus, for example, in a case where the output frequency is 50 Hz, and there are four poles (the number of pole pairs is 2), the rotation frequency is estimated as 25 Hz. In a case where the output frequency is 30 Hz, and there are six poles (the number of pole pairs is 3), the rotation frequency is estimated as 10 Hz. In a case where the output frequency is 100 Hz, and there are two poles (the number of pole pairs is 1), the rotation frequency is estimated as 100 Hz.

The feature amount waveform extraction unit 17 extracts the waveform in the frequency range between zero and the rotation frequency, which is a specified frequency range, with respect to the current vector norm or the torque current, by receiving the results of the amount-to-be-analyzed calculated by the amount-to-be-analyzed calculation unit 16 and the rotation frequency estimated by the rotation frequency estimation unit 15 (step S105). In a diagnosis algorithm provided in the power conversion device 10 of Example 1, the frequency analysis is not implemented, and thus, it is not possible to recognize the type of frequency spectrum during the diagnosis. Here, the frequency spectrum is used only to describe the algorithm.

Figure 5:
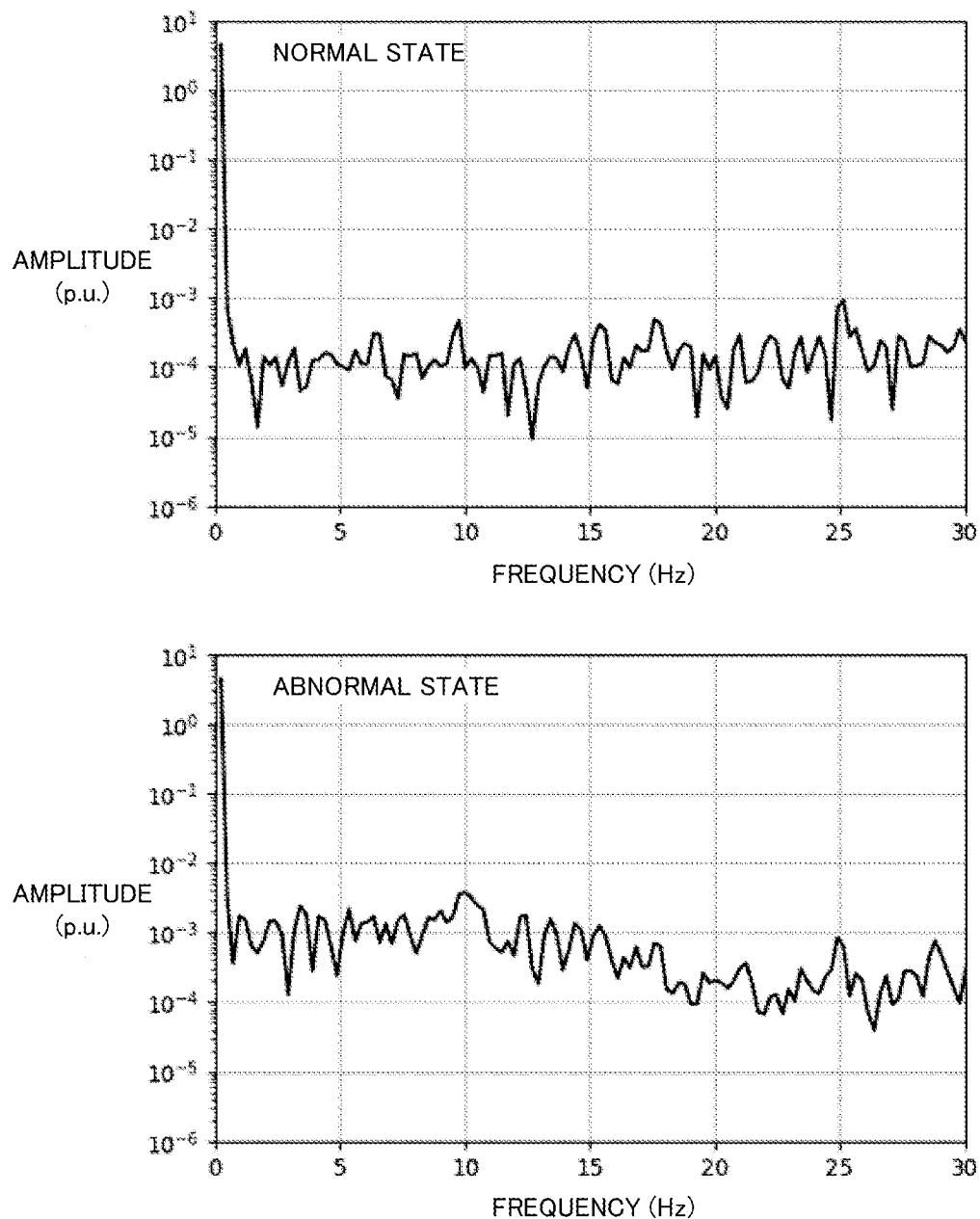
FIG. 5 is a frequency spectrum of the representative current vector norm waveform that is calculated in Example 1.
Figure 6:
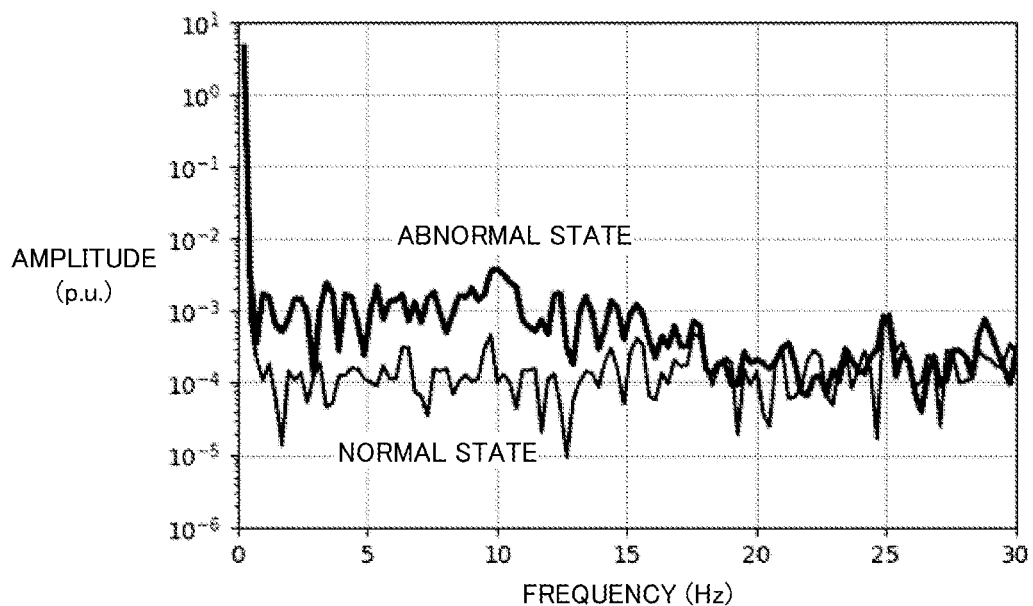
FIG. 6 is a comparative diagram of a normal state and an abnormal state of the frequency spectrum of the representative current vector norm waveform that is calculated in Example 1.

FIG. 5 is a diagram showing the frequency spectrum of the current vector norm that is calculated as described above, with respect to the rotating machine 30 in the normal state and the rotating machine 30 in the abnormal state. FIG. 6 is a diagram in which the frequency spectra of the current vector norm of FIG. 5 are superimposed.

As shown in such drawings, it is found that a difference between the rotating machine 30 in the normal state and the rotating machine 30 in the abnormal state is remarkable in a range of 0 Hz to 20 Hz. This corresponds to a phenomenon in which a spectrum level of a basic wave frequency of ±20 Hz of the phase current increases due to the abnormality of the bearing, which is known in the related art.

In the current vector norm or the torque current, the basic wave frequency component of the phase current is converted into the direct current (0 Hz) component to be the maximum component. In addition, a slight eccentricity is allowed even in the rotating machine 30 in the normal range, and thus, it is found that a slight peak occurs at the rotation frequency (in the example of FIG. 5, 25 Hz). For this reason, in order to detect the abnormality with a high sensitivity without performing the frequency analysis, it is necessary to sufficiently remove the direct current component and the rotation frequency component that are main components included in normal data.

Therefore, in Example 1, the feature amount waveform extraction unit 17 sequentially cuts out a frequency range between the direct current component and the rotation frequency component with a filter. It is not necessary to accumulate data for a certain period as with the case of performing the frequency analysis, and thus, even in a case where the memory amount is small, the function can be performed. In order to increase a detection sensitivity, the direct current component and the rotation frequency component are not included in the frequency range between the direct current component and the rotation frequency component.

In addition, when the rotation frequency is changed on the basis of the rotation frequency estimated by the rotation frequency estimation unit 15, a frequency range to be extracted is changed as necessary such that the rotation frequency component is not picked up. For this reason, a filter having a plurality of different transfer characteristics corresponding to the frequency range after being changed may be prepared in advance such that the frequency range can be changed. Alternatively, a parameter of the filter may be set as a function of the rotation frequency, and the parameter of the filter may be changed in accordance with a change in the rotation frequency. Here, the parameter of the filter includes a cutoff frequency.

Variable-speed driving of the rotating machine can also be supported by changing the frequency to be extracted such that the rotation frequency component is not picked up. Here, the range to be cut out decreases as the rotation frequency decreases, and thus, the sensitivity for detecting the abnormality decreases.

In order to sufficiently attenuate the direct current component, a highpass filter is used. In addition, in order to sufficiently attenuate the rotation frequency component, a lowpass filter is used. Alternatively, the direct current component and the rotation frequency component may be attenuated together with a bandpass filter.

In a case where there is an error in the current measurement, and there is unbalance in three phases, the basic wave frequency component may slightly remain even in the current vector norm or the torque current. In a case where the performance of the filter is sufficient, the rotation frequency can be attenuated, and the basic wave frequency component of a higher frequency can also be attenuated, but in a case where the performance of the filter is insufficient in low cost design, there may be a case where the rotation frequency can be attenuated, but the basic wave frequency component remains. Therefore, in order to remove the basic wave frequency component at a low cost, a notch filter that is a band removal filter of a narrow band may be added to the lowpass filter, the bandpass, and the like.

The present inventors have found that in many rotating machine systems, when the amplitude of the direct current component of the current vector norm or the torque current (corresponding to the basic wave frequency component of the phase current) is set to 1, the amplitude of the rotation frequency component is approximately $10^{-4}$ to $10^{-3}$, and the level of the frequency range between zero and the rotation frequency is approximately $10^{-3}$ to $10^{-4}$ in the normal state and is approximately $10^{-4}$ to $10^{-3}$ in the abnormal state, from years of studies of the rotating machine system. For this reason, in order to detect the abnormality with a high sensitivity by sufficiently attenuating the direct current component and the rotation frequency component, it is necessary to make the filter precipitous. At least a ratio of a gain in a block band to a gain in a pass band is set to be less than or equal to 1%, and a transition band may be set to be less than or equal to half of the rotation frequency, desirably less than or equal to ⅓ of the rotation frequency.

Figure 7:
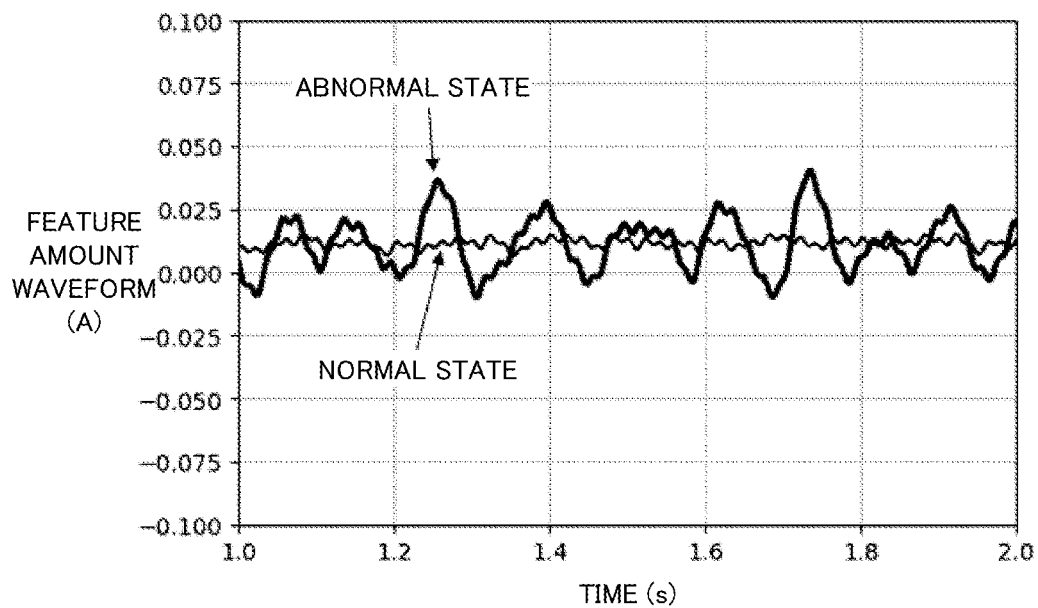
FIG. 7 is a diagram showing a representative feature amount waveform that is calculated in Example 1.

An example of a feature amount waveform that is obtained by cutting out the frequency range between zero and the rotation frequency with a filter satisfying the conditions described above is shown in FIG. 7. It is found that the amplitude increases in the abnormal state, compared to the normal state.

Next, the abnormality degree calculation unit 18 calculates an abnormality degree from the waveform obtained by the feature amount waveform extraction unit 17 (step S106). For example, the abnormality degree is set by combining an absolute value or a square value of the obtained waveform for a given length of time. Alternatively, the calculated abnormality degree may be standardized by the amplitude of the basic wave frequency component of the phase current, or the direct current component extracted from the current vector norm or the torque current. Accordingly, even in a case where the direct current component is temporally changed due to a load variation, the diagnosis can be performed. In addition, in a case where the abnormality degree is transmitted to the outside, a communication load can be reduced.

Then, the abnormality degree calculation unit 18 determines a failure symptom by determining whether or not the calculated abnormality degree is greater than a threshold value set in advance (step S107). In a case where the abnormality degree is greater than the threshold value, the abnormality degree calculation unit 18 diagnoses that there is a failure symptom and instructs the output unit 19 to issue a warning. The threshold value may be set by the results of separate consideration with a testing machine or the like, or may be set by learning in the actual environment. For example, the abnormality degree is calculated a plurality of times during a learning period, an average value and a variation range thereof are obtained, and the threshold value is set such that misinformation is not generated.

In addition, the calculated abnormality degree may be output along with other parameters for defining a driving state of the rotating machine 30 such that accurate diagnosis can be performed with machine learning or the like. In a case where such multivariable data is recorded with a logger or the like and is analyzed with a machine learning algorithm such as vector quantization clustering, there is a possibility that an imperceptible abnormality that is not capable of being detected in the determination of the threshold value can also be detected.

Finally, the output unit 19 outputs a diagnosis result such as an abnormality degree or a failure symptom determination result (step S108), and completes the diagnosis. An output method may be a method of appealing human senses such as a display, a lamp, and a buzzer, or may be a method of recording the diagnosis result in paper or an electronic file. Alternatively, the diagnosis result may be transmitted through a communication network.

The abnormality degree calculation unit 18 or the output unit 19 may be disposed in a calculator outside the power conversion device 10, and may acquire the waveform extracted from the feature amount waveform extraction unit 17 through a network. In addition, in order for the processing of step S107, a failure symptom determination unit may be configured independently from the abnormality degree calculation unit 18. In addition, the failure symptom determination unit may be disposed in the calculator that is connected to the power conversion device 10 through the network, and the abnormality degree calculation unit 18 may send the calculated abnormality degree to the calculator through the network, and thus, the failure symptom determination may be performed with the outside calculator.

According to Example 1, the frequency analysis having a large calculation load is not implemented, and thus, the diagnosis can be performed with the microcomputer and the current sensor mounted on the power conversion device 10. In addition, the diagnosis algorithm is provided in which main components included in data of the rotating machine in a normal range, such as the direct current component and the rotation frequency component of the current vector norm or the torque current, can be efficiently removed. For this reason, high-sensitivity diagnosis can be performed, and the failure symptom can be detected at an early point. Accordingly, a power conversion device having a function of detecting the failure symptom of the rotating machine system at a low cost and at an early point, and a rotating machine system using the power conversion device can be attained.

Further, the basic wave frequency component may be the direct current component by calculating the current vector norm or the torque current with the amount-to-be-analyzed calculation unit, and the feature amount waveform extraction unit 17 may only perform differentiation in order to remove the component, and thus, simplification can be attained.

In addition, in Example 1, the basic wave frequency and the rotation frequency are generally converted into a low frequency by the conversion to the amount-to-be-analyzed. For this reason, the frequency range to be extracted can be lowered, and the sampling can also be performed at a low speed, and thus, a reduction in the cost can be attained.

Further, in Patent Document 1, a range of ±20 Hz is cut out regardless of the rotation frequency, and thus, the rotation frequency component may be cut out, and thus, it is necessary to remove the rotation frequency component. In Example 1, even in a case where the rotation frequency is changed, the feature amount waveform extraction unit 17 is capable of changing the frequency range to be extracted, on the basis of the rotation frequency estimated by the rotation frequency estimation unit 15, such that the rotation frequency component is not picked up.

Example 2

Figure 8:
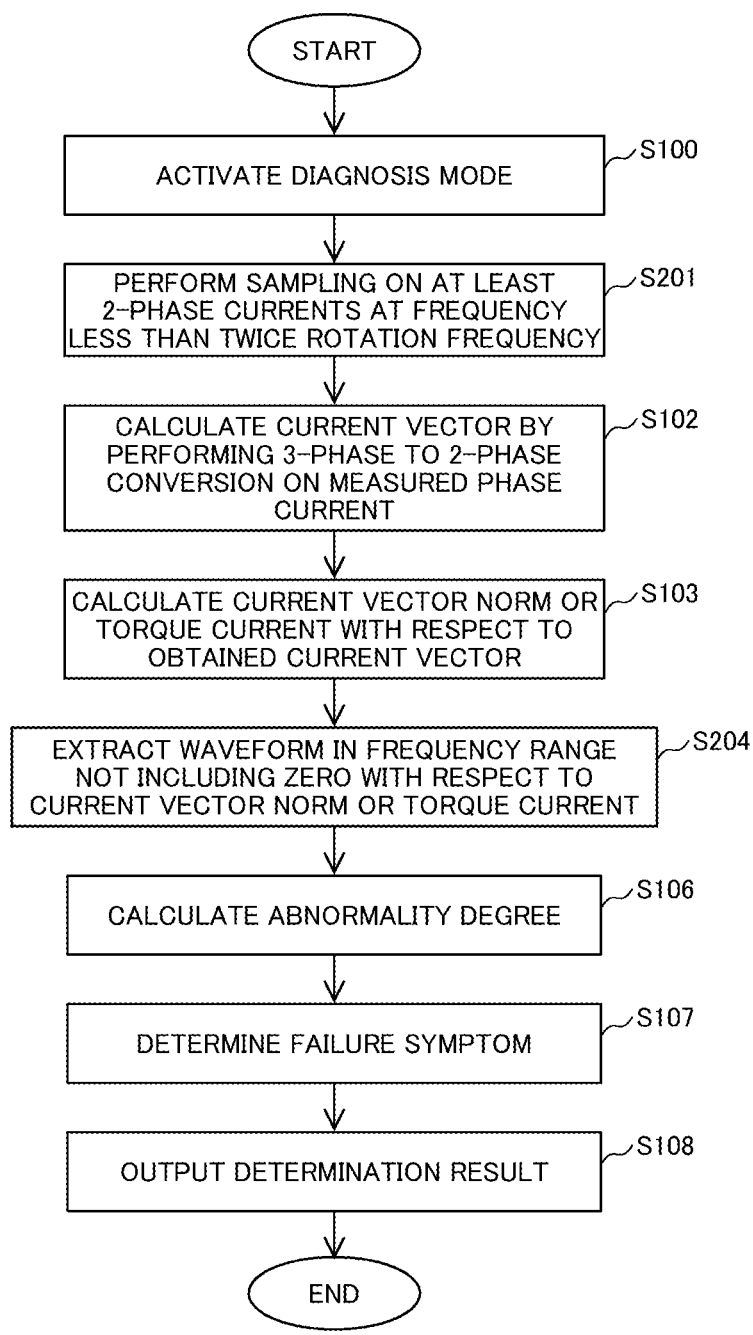
FIG. 8 is a flowchart for diagnosing an abnormality of a rotating machine system of Example 2.

FIG. 8 is a flowchart for diagnosing the abnormality of the rotating machine system by the power conversion device 10 of Example 2. In FIG. 8, step S100, step S102, step S103, and step S106 to step S108 are identical to those in FIG. 2.

A difference from Example 1 is that the current measurement unit 13 performs the sampling on the phase current at a frequency less than twice the rotation frequency (step S201). Accordingly, components at a frequency higher than or equal to the rotation frequency can be removed in advance, and thus, in the processing of the feature amount waveform extraction unit 17, it is not necessary to remove the frequency component at the frequency higher than or equal to the rotation frequency. Accordingly, the feature amount waveform extraction unit 17 extracts a waveform in a frequency range not including zero with respect to the current vector norm or the torque current (step S204), and thus, the feature amount waveform extraction unit 17 is simplified.

In addition, the rotation frequency estimation unit 15 estimating the rotation frequency based on the phase current is not necessary. Here, in order to set a sampling frequency, the rotation frequency is estimated from a motor control command, before the sampling.

In addition, it is necessary to perform anti-aliasing processing with hardware or software, before the sampling. Specifically, components at a frequency higher than or equal to ½ of the sampling frequency (a Nyquist frequency) are removed with the filter.

According to Example 2, the lowpass filter or the bandpass filter for removing the components at a frequency higher than or equal to the rotation frequency is not necessary.

Example 3

Figure 9:
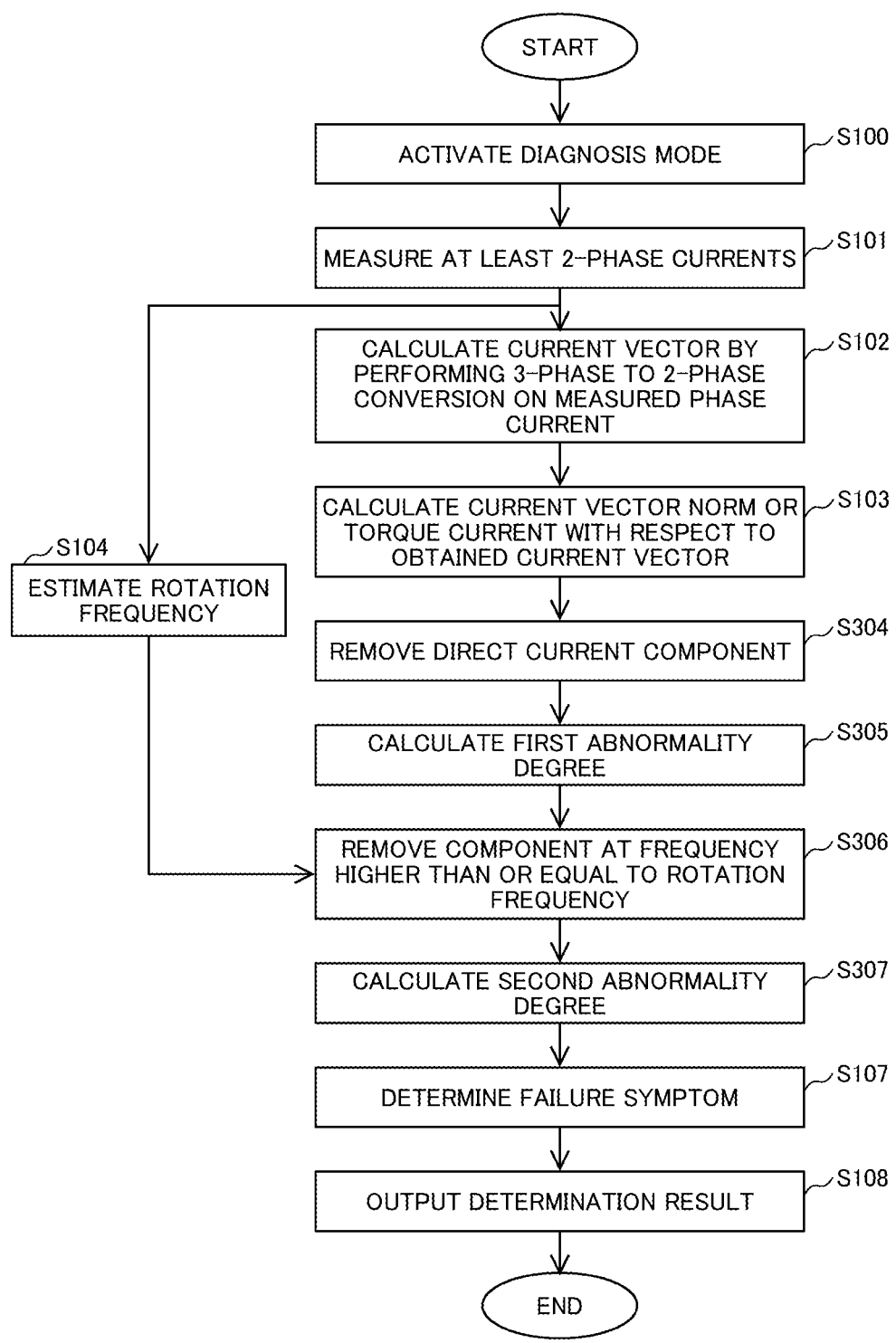
FIG. 9 is a flowchart for diagnosing an abnormality of a rotating machine system of Example 3.

FIG. 9 is a flowchart for diagnosing the abnormality of the rotating machine system by the power conversion device 10 of Example 3. In FIG. 9, step S100 to step S104, and step S107 and step S108 are identical to those in FIG. 2.

A difference from Example 1 and Example 2 is step S304 to step S307.

In Example 3, first, the feature amount waveform extraction unit 17 removes (attenuates) the direct current component of the current vector norm or the torque current as the amount-to-be-analyzed (step S304). The abnormality degree calculation unit 18 calculates a first abnormality degree, on the basis of the extracted waveform (step S305). After that, as with Example 1, the feature amount waveform extraction unit further removes (attenuates) the components at the frequency higher than or equal to the rotation frequency by receiving the rotation frequency estimated by the rotation frequency estimation unit 15 (step S306). Then, the abnormality degree calculation unit 18 calculates a second abnormality degree, on the basis of the extracted waveform (step S307).

The first abnormality degree is sensitive to a change in the rotation frequency component, and thus, degradation in the degree of eccentricity of the rotating machine can be detected. On the other hand, as with Example 1 or Example 2, an increase in the general friction variation of the bearing can be mainly detected by the second abnormality degree.

According to Example 3, a wider range of abnormalities of the rotating machine system can be diagnosed. In addition, even in a case where the rotation frequency is changed, the frequency range to be extracted can be changed such that the rotation frequency component is not picked up.

Example 4

FIG. 10 is a schematic view of a pump in which the power conversion device 10 to which Example 1 to Example 3 are applied and the rotating machine system are built. An impeller 41 is attached to the rotating machine (the motor) 30 connected to the power conversion device 10, and a liquid such as water is suctioned and conveyed. In the implementation of abnormality diagnosis, a time zone is desirable in which rotation is performed at a constant speed and a constant load, and thus, for example, diagnosis is performed at night or the like when a water conveyance amount is comparatively stable, in one day.

In addition, in FIG. 10, a calculator 100 that is connected to the power conversion device 10 through a network or the like is disposed, unlike the power conversion device 10 of Example 1, and the abnormality degree calculation unit 18, the failure symptom determination unit, and the output unit 19 of Example 1 are provided in the calculator 100.

Example 1 to Example 3 can be applied to a rotating machine system in which a power conversion device such as an air compressor, a conveyance table, a machine tool such as a servo press machine or an injection machine, and a fan, is built, in addition to the application to the pump.

The power conversion device 10 in the examples described above can be applied to a power conversion device such as general-purpose inverter, a servo amplifier, and a DCBL controller. In addition, the examples described above can also be applied to a rotating machine system in which the power conversion device as described above is built, and a wind-power generation system, a hybrid automobile, an electric automobile, a fuel cell vehicle, a rail vehicle, and the like.

REFERENCE SIGNS LIST

10 Power conversion device
20 Power source
30 Rotating machine
31 Bearing
40 Load machine

The invention claimed is:

1. A power conversion device, comprising:
a current sensor configured to detect a phase current; and
a microcomputer configured to
measure the phase current;
calculate a current vector by performing 3-phase to 2-phase conversion on the phase current;
calculate an amount-to-be-analyzed, on the basis of the current vector, wherein the amount-to-be-analyzed is a current vector norm;
extract a waveform in a specific frequency range, on the basis of the amount-to-be-analyzed;
remove a direct current component of the amount-to-be-analyzed;
calculate a first abnormality degree after removing the direct current component;
remove a rotation frequency component of the amount-to-be-analyzed; and
calculate a second abnormality degree after removing the rotation frequency component.

2. The power conversion device according to claim 1,
wherein the power conversion device is connected to a rotating machine, and
the microcomputer is further configured to estimate a rotation frequency of the rotating machine.

3. The power conversion device according to claim 1,
wherein the specific frequency range is a frequency range between zero and a rotation frequency.

4. The power conversion device according to claim 1,
wherein the microcomputer performs sampling on the phase current at a frequency less than twice a rotation frequency.

5. The power conversion device according to claim 2,
wherein the microcomputer changes a frequency range to be extracted, on the basis of the estimated rotation frequency.

6. The power conversion device according to claim 1,
wherein the microcomputer sets the first abnormality degree by combining an absolute value or a square value of the waveform extracted for a given length of time.

7. The power conversion device according to claim 1,
wherein the microcomputer standardizes the first abnormality degree with an amplitude of a basic wave frequency component of the phase current or a direct current component extracted from the amount-to-be-analyzed.

8. The power conversion device according to claim 1,
wherein the microcomputer extracts the waveform in the specific frequency range by a filter selected from a highpass filter, a lowpass filter, and a bandpass filter.

9. The power conversion device according to claim 8,
wherein the microcomputer includes a notch filter attenuating a basic wave frequency component.

10. The power conversion device according to claim 1,
further comprising a calculator configured to determine the first abnormality degree and the second abnormality degree;
wherein the calculator is provided outside the power conversion device.

11. A diagnosis method of diagnosing a system provided with a power conversion device that includes a current sensor and a microcomputer, the method comprising:
detecting, by the current sensor, a phase current;
measuring, by the microcomputer, the phase current;
calculating, by the microcomputer, a current vector by performing 3-phase to 2-phase conversion on the phase current;
calculating, by the microcomputer, an amount-to-be-analyzed, on the basis of the current vector, wherein the amount-to-be-analyzed is a current vector norm;
extracting, by the microcomputer, a waveform in a specific frequency range, on the basis of the amount-to-be-analyzed;
removing a direct current component of the amount-to-be-analyzed;
calculating a first abnormality degree after removing the direct current component;
removing a rotation frequency component of the amount-to-be-analyzed; and
calculating a second abnormality degree after removing the rotation frequency component.

* * * * *